（12） United States Patent
Chiu et al.

(10) Patent No.: US 12,211,833 B2
(45) Date of Patent: Jan. 28, 2025

(54) ELECTROSTATIC DISCHARGE PROTECTION STRUCTURE

(71) Applicant: UNITED MICROELECTRONICS CORP., Hsin-Chu (TW)

(72) Inventors: Hou-Jen Chiu, Taichung (TW); Mei-Ling Chao, Tainan (TW); Tien-Hao Tang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 346 days.

(21) Appl. No.: 17/742,392

(22) Filed: May 11, 2022

(65) Prior Publication Data

US 2023/0326919 A1    Oct. 12, 2023

(30) Foreign Application Priority Data

Apr. 6, 2022    (TW) .................................. 111113048

(51) Int. Cl.
 *H01L 27/02*    (2006.01)
(52) U.S. Cl.
 CPC ............................... *H01L 27/0259* (2013.01)
(58) Field of Classification Search
 None
 See application file for complete search history.

(56) References Cited

U.S. PATENT DOCUMENTS

| | | | | |
|---|---|---|---|---|
| 7,368,761 B1* | 5/2008 | Lai | ...................... | H01L 27/0262 |
| | | | | 257/E29.105 |
| 8,507,981 B2* | 8/2013 | Chen | ................... | H01L 27/0277 |
| | | | | 257/341 |
| 8,896,024 B1 | 11/2014 | Chen | | |
| 2014/0284720 A1* | 9/2014 | Chen | ................... | H01L 29/0847 |
| | | | | 257/355 |
| 2015/0069424 A1* | 3/2015 | Willemen | ............. | H01L 31/173 |
| | | | | 257/84 |
| 2015/0221634 A1* | 8/2015 | Chen | ................. | H01L 29/66659 |
| | | | | 257/355 |

* cited by examiner

*Primary Examiner* — Bilkis Jahan
(74) *Attorney, Agent, or Firm* — Winston Hsu

(57) ABSTRACT

An electrostatic discharge protection structure includes a semiconductor substrate, a gate structure disposed on the semiconductor substrate, a first well region of a first conductivity type disposed in the semiconductor substrate, a first doped region of the first conductivity type, a second doped region of a second conductivity type, a third doped region of the first conductivity type, and a fourth doped region of the second conductivity type. The first and second doped regions are disposed in the first well region and connected with each other. The second doped region is an emitter of a first bipolar junction transistor. The third and fourth doped regions are disposed in the semiconductor substrate and connected with each other. The third and second doped regions are located at two opposite sides of the gate structure in a first horizontal direction. The third doped region is an emitter of a second bipolar junction transistor.

19 Claims, 17 Drawing Sheets

ELECTROSTATIC DISCHARGE PROTECTION STRUCTURE

BACKGROUND OF THE INVENTION

1. Field of the Invention

The present invention relates to an electrostatic discharge protection structure, and more particularly, to an electrostatic discharge protection structure including a bipolar junction transistor.

2. Description of the Prior Art

Electrostatic discharge (ESD) is a discharge effect where charges accumulate on a non-conductor or an ungrounded conductor and travel rapidly through a discharge path in a short period of time, and ESD can cause damage to integrated circuits. Generally, the human bodies, the machines for IC packaging, the instruments for testing the integrated circuit, etc. are all common charged bodies. When the charged body is in contact with the chip or wafer, the charged body will discharge to the chip or wafer. The transient power of electrostatic discharge can cause damage or failure of the wafer or integrated circuits within the wafer. Therefore, ESD protection structures are provided in integrated circuits for improving the above-mentioned problems.

SUMMARY OF THE INVENTION

An electrostatic discharge protection structure is provided in the present invention. Doped regions of different conductivity types are connected with doped regions used as emitters of bipolar junction transistors (BJTs) for reducing the emitter injection efficiency and enhancing the holding voltage of the electrostatic discharge protection structure.

According to an embodiment of the present invention, an electrostatic discharge protection structure is provided. The electrostatic discharge protection structure includes a semiconductor substrate, a gate structure, a first well region of a first conductivity type, a first doped region of the first conductivity type, a second doped region of a second conductivity type, a third doped region of the first conductivity type, and a fourth doped region of the second conductivity type. The gate structure is disposed on the semiconductor substrate. The first well region is disposed in the semiconductor substrate. The first doped region is disposed in the first well region. The second doped region is disposed in the first well region. The second doped region is connected with the first doped region, and the second doped region is an emitter of a first bipolar junction transistor. The third doped region is disposed in the semiconductor substrate. The third doped region and the second doped region are located at two opposite sides of the gate structure in a first horizontal direction. The fourth doped region is disposed in the semiconductor substrate. The fourth doped region is connected with the third doped region, and the third doped region is an emitter of a second bipolar junction transistor.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
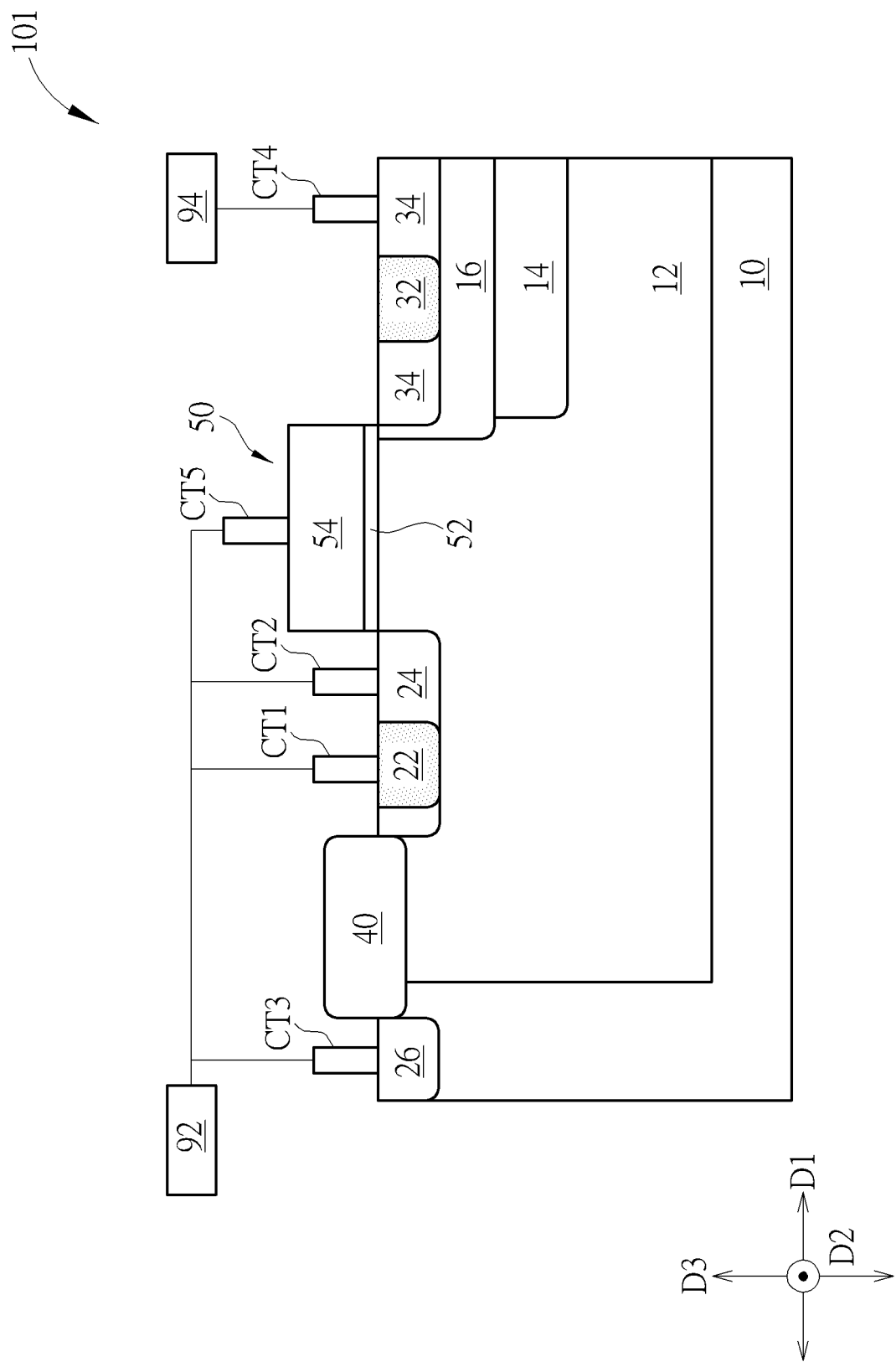
FIG. 1 is a schematic drawing illustrating an electrostatic discharge protection structure according to a first embodiment of the present invention.
Figure 2A:
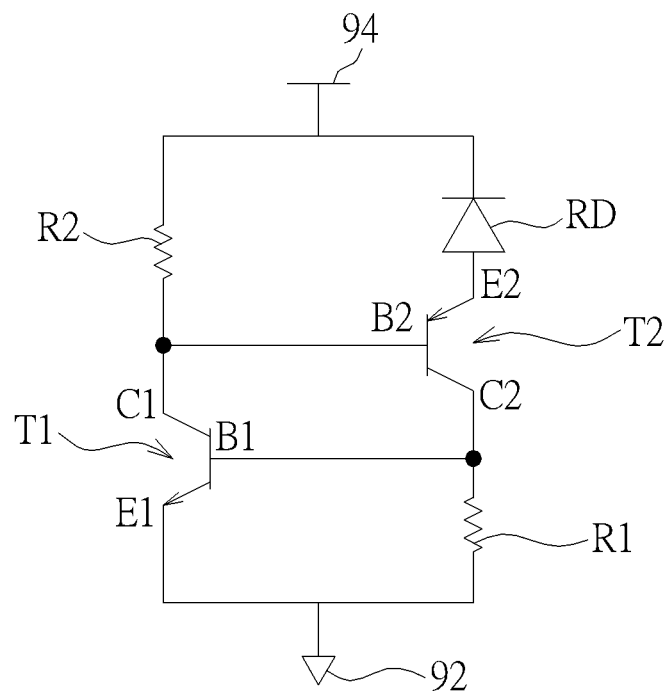
FIG. 2A is a schematic equivalent circuit diagram of an electrostatic discharge protection structure according to an embodiment of the present invention.
Figure 2B:
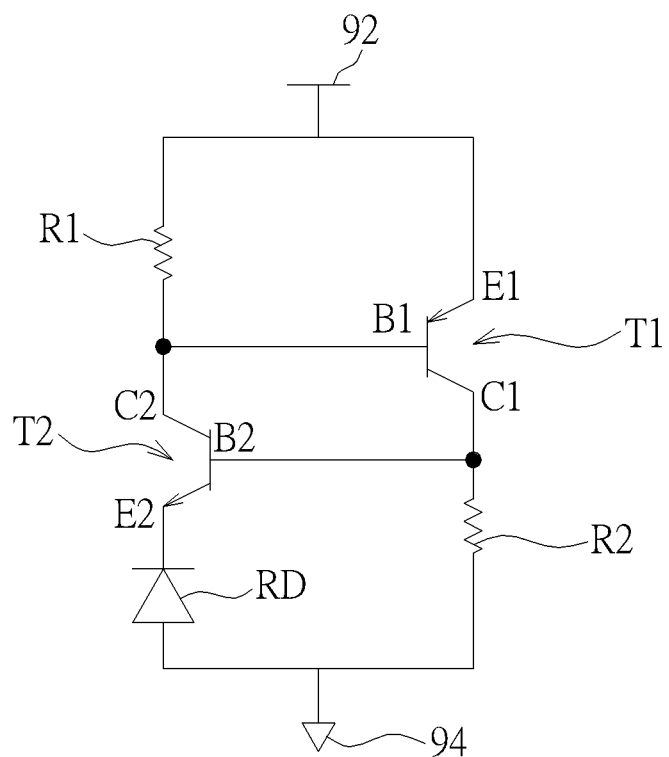
FIG. 2B is a schematic equivalent circuit diagram of an electrostatic discharge protection structure according to another embodiment of the present invention.

Please refer to FIG. 1, FIG. 2A, and FIG. 2B. FIG. 1 is a schematic drawing illustrating an electrostatic discharge protection structure 101 according to a first embodiment of the present invention, FIG. 2A is a schematic equivalent circuit diagram of an electrostatic discharge protection structure according to an embodiment of the present invention, and FIG. 2B is a schematic equivalent circuit diagram of an electrostatic discharge protection structure according to another embodiment of the present invention. As shown in FIG. 1, the electrostatic discharge protection structure 101 includes a semiconductor substrate 10, a gate structure 50, a first well region 12 of a first conductivity type, a first doped region 22 of the first conductivity type, a second doped region 24 of a second conductivity type, a third doped region 32 of the first conductivity type, and a fourth doped region 34 of the second conductivity type. The gate structure 50 is disposed on the semiconductor substrate 10. The first well region 12 is disposed in the semiconductor substrate 10. The first doped region 22 is disposed in the first well region 12. The second doped region 24 is disposed in the first well region 12. The second doped region 24 is connected with the first doped region 22, and the second doped region 24 is an emitter of a first bipolar junction transistor (BJT). The third doped region 32 is disposed in the semiconductor substrate 10. The fourth doped region 34 is disposed in the semiconductor substrate 10. The third doped region 32 and the second doped region 24 are located at two opposite sides of the gate structure 50 in a first horizontal direction D1. The fourth doped region 34 is connected with the third doped region 32, and the third doped region 32 is an emitter of a second bipolar junction transistor. The area occupied by the emitter may be reduced by the doped region of the conductivity type different from that of the doped region used as the emitter of the bipolar junction transistor and connected with the doped region used as the emitter of the bipolar junction transistor. Therefore, the emitter injection efficiency of the corresponding bipolar junction transistor may be lowered, and the holding voltage and/or other related electrical performance of the electrostatic discharge protection structure may be enhanced accordingly.

In the present invention, the first conductivity type is complementary to the second conductivity type. The second conductivity type may be N type when the first conductivity type is P type, and the second conductivity type may be P type when the first conductivity type is N type. For example, when the first conductivity type is P type and the second conductivity type is N type, the second doped region 24 may be an emitter of an NPN BJT, and the third doped region 32 may be an emitter of a PNP BJT. Comparatively, when the first conductivity type is N type and the second conductivity type is P type, the second doped region 24 may be an emitter of a PNP BJT, and the third doped region 32 may be an emitter of an NPN BJT, but not limited thereto. In some embodiments, the doped regions and the well regions may be formed by performing suitable doping processes (such as implantation processes or other doping approaches) to the semiconductor substrate 10. For example, some regions of the semiconductor substrate 10 may be doped with N type dopants for forming N type doped regions or N type well regions, or some regions of the semiconductor substrate 10 may be doped with P type dopants for forming P type doped regions or P type well regions. The N type dopants described above may include phosphorus (P), arsenic (As), or other suitable N-type dopant materials, and the P type dopants described above may include boron (B), gallium (Ga), or other suitable P type dopant materials.

Specifically, in some embodiments, a vertical direction D3 may be regarded as a thickness direction of the semiconductor substrate 10, and the semiconductor substrate 10 may have a top surface and a bottom surface opposite to the top surface in the vertical direction D3. The gate structure 50 described above may be disposed on the top surface of the semiconductor substrate 10, and the first doped region 22, the second doped region 24, the third doped region 32, and the fourth doped region 34 may be located at a side relatively adjacent to the top surface. Additionally, in some embodiments, the horizontal directions (such as the first horizontal direction D1 and the second horizontal direction D2 orthogonal to the first horizontal direction D1) may be substantially orthogonal to the vertical direction D3, and the horizontal directions may be parallel with the top surface and/or the bottom surface of the semiconductor substrate 10, but not limited thereto. In this description, a distance between the bottom surface of the semiconductor substrate 10 and a relatively higher location and/or a relatively higher part in the vertical direction D3 is greater than a distance between the bottom surface of the semiconductor substrate 10 and a relatively lower location and/or a relatively lower part in the vertical direction D3. The bottom or a lower portion of each component may be closer to the bottom surface of the semiconductor substrate 10 in the vertical direction D3 than the top or upper portion of this component. Another component disposed above a specific component may be regarded as being relatively far from the bottom surface of the semiconductor substrate 10 in the vertical direction D3, and another component disposed under a specific component may be regarded as being relatively closer to the bottom surface of the semiconductor substrate 10 in the vertical direction D3.

In some embodiments, the second doped region 24 may directly contact the first doped region 22, and the fourth doped region 34 may directly contact the third doped region 32. Additionally, a part of the second doped region 24 may be located between the first doped region 22 and the gate structure 50 in the first horizontal direction D1, and a part of the fourth doped region 34 may be located between the third doped region 32 and the gate structure 50 in the first horizontal direction D1. In some embodiments, the second doped region 24 may surround the first doped region 22 in the first horizontal direction D1 and/or in the second horizontal direction D2, and the fourth doped region 34 may surround the third doped region 32 in the first horizontal direction D1 and/or in the second horizontal direction D2, but not limited thereto.

In some embodiments, the electrostatic discharge protection structure 101 may further include a second well region 14 of the second conductivity type and a third well region 16 of the second conductivity type, and the second well region 14 and the third well region 16 may be disposed in the first well region 12. In some embodiments, the third doped region 32 and the fourth doped region 34 may be located above the second well region 14 in the vertical direction D3, and the third well region 16 may be partly located between the third doped region 32 and the second well region 14 in the vertical direction D3 and partly located between the fourth doped region 34 and the second well region 14 in the vertical direction D3. In some embodiments, a dopant concentration in the third well region 16 may be lower than a dopant concentration in the fourth doped region 34 and higher than a dopant concentration in the second well region 14, and the dopant concentration in the third well region 16 may vary with gradient in a specific direction (such as in the vertical direction D3, but not limited thereto), but not limited thereto. In some embodiments, the second well region 24, the first well region 12, and the second doped region 14 (or the second well region 14 and the third well region 16) may form the first bipolar junction transistor described above, and the third doped region 32, the second well region 14 (or the second well region 14 and the third well region 16) and the first well region 12 may form the second bipolar junction transistor described above, but not limited thereto.

In some embodiments, the gate structure 50 may include a gate dielectric layer 52 and a gate electrode 54 disposed on the gate dielectric layer 52. The gate dielectric layer 52 may include gate oxide, high dielectric constant (high-k) dielectric materials, or other suitable dielectric materials, and the gate electrode 54 may include non-metallic electrically conductive materials (such as doped polysilicon) or metallic electrically conductive materials, but not limited thereto. In some embodiments, the gate structure 50, the second doped region 24, the fourth doped region 34, and the first well region 12 may form a metal oxide semiconductor (MOS) structure, and the first bipolar junction transistor and the second bipolar junction transistor described above may be regarded as parasite bipolar junction transistors in this MOS structure, but not limited thereto. For example, when the first conductivity type is P type and the second conductivity type is N type, the MOS structure described above may be an NMOS structure, and the MOS structure described above may be a PMOS structure when the first conductivity type is N type and the second conductivity type is P type, but not limited thereto. Additionally, in some embodiments, the second doped region 24 may be electrically connected to a first electrode 92, and the fourth doped region 34 may be electrically connected to a second electrode 94. For example, the second doped region 24 may be electrically connected to the first electrode 92 via one or a plurality of contact structure CT2 disposed on the second doped region 24, and the fourth doped region 34 may be electrically connected to the second electrode 94 via one or a plurality of contact structure CT4 disposed on the fourth doped region 34. It is worth noting that the third doped region 32 is not electrically connected to the second electrode 94 directly as there is not any contact structure disposed on the third doped region 32, a diode (such as a reverse diode) may be formed between the third doped region 32 and the fourth doped region 34, and the diode may be electrically connected to the second bipolar junction transistor described above. The diode may be used to further enhance the holding voltage and/or other related electrical performance of the electrostatic discharge protection structure, but not limited thereto.

In some embodiments, the first doped region 22 may be electrically connected to the first electrode 92 via one or a plurality of contact structures CT1 disposed on the first doped region 22, and the gate structure 50 may be electrically connected to the first electrode 92 via one or a plurality of contact structures CT5 disposed on the gate structure 50, but not limited thereto. In addition, each contact structure may include a low resistivity material (such as copper, aluminum, tungsten, and so forth) and a barrier layer (such as titanium nitride, tantalum nitride, or other suitable electrically conductive barrier materials) surrounding the low resistivity material, but not limited thereto. As shown in FIG. 1 and FIG. 2A, in some embodiments, a diode RD may be formed between the third doped region 32 and the fourth doped region 34. Two terminals of the diode RD may be electrically connected to the second electrode 94 and the second bipolar junction transistor T2, respectively, and the emitter E1 of the first bipolar junction transistor T1 may be electrically connected to the first electrode 92. In some embodiments, the second doped region 24 may be regarded as the emitter E1 of the first bipolar junction transistor T1, the first well region 12 may be regarded as the base B1 of the first bipolar junction transistor T1, and the second well region 14 and/or the third well region 16 may be regarded as the collector C1 of the first bipolar junction transistor T1. Additionally, the third doped region 32 may be regarded as the emitter E2 of the second bipolar junction transistor T2, the second well region 14 and/or the third well region 16 may be regarded as the base B2 of the second bipolar junction transistor T2, and the first well region 12 may be regarded as the collector C2 of the second bipolar junction transistor T2. Therefore, the base B1 of the first bipolar junction transistor T1 may be electrically connected with the collector C2 of the second bipolar junction transistor T2, and the collector C1 of the first bipolar junction transistor T1 may be electrically connected with the base B2 of the second bipolar junction transistor T2. Additionally, the resistance R1 illustrated in FIG. 2A may be regarded as a resistance of the first well region 12, and the resistance R2 illustrated in FIG. 2A may be regarded as a resistance of the second well region 14 and/or the third well region 16, but not limited thereto.

As shown in FIG. 1 and FIG. 2A, in some embodiments, the first conductivity type may be P type and the second conductivity type may be N type. Under this situation, the first bipolar junction transistor T1 may be an NPN BJT, the second bipolar junction transistor T2 may be a PNP BJT, the first electrode 92 may be a cathode, and the second electrode 94 may be an anode. Comparatively, as shown in FIG. 1 and FIG. 2B, in some embodiments, the first conductivity type may be N type and the second conductivity type may be P type. Under this situation, the first bipolar junction transistor T1 may be a PNP BJT, the second bipolar junction transistor T2 may be an NPN BJT, the first electrode 92 may be an anode, and the second electrode 94 may be a cathode.

As shown in FIG. 1, in some embodiments, the electrostatic discharge protection structure 101 may further include an isolation structure 40 and a doped region 26 of the first conductivity type. The doped region 26 may be disposed in the semiconductor substrate 10, and at least a part of the isolation structure 40 may be disposed in the semiconductor substrate 10 and located between the second doped region 24 and the doped region 26. In some embodiments, the isolation structure 40 may include a field oxide layer, trench isolation, or other suitable insulating isolation structures, and the doped region 26 may be electrically connected to the first electrode 92 via one or a plurality of contact structures CT3 disposed on the doped region 26, but not limited thereto.

Figure 3:
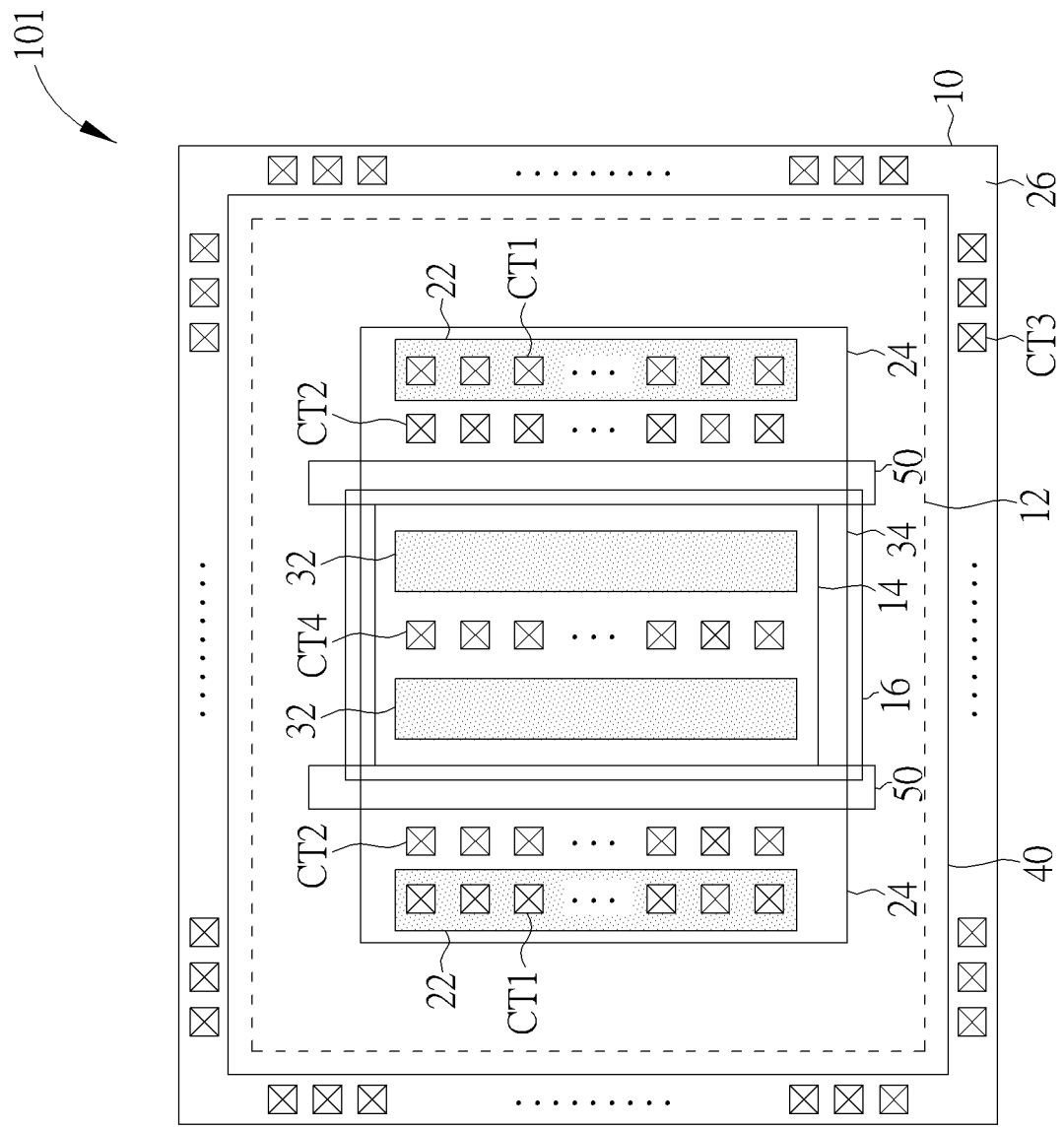
FIG. 3 is a schematic drawing illustrating a top view of an electrostatic discharge protection structure according to an embodiment of the present invention.

Please refer to FIG. 1 and FIG. 3. FIG. 3 is a schematic drawing illustrating a top view of an electrostatic discharge protection structure according to an embodiment of the present invention. In some embodiments, FIG. 1 may be regarded as a cross-sectional schematic diagram of an area in the electrostatic discharge protection structure illustrated in FIG. 3, but not limited thereto. As shown in FIG. 1 and FIG. 3, in some embodiments, the electrostatic discharge protection structure 101 may include a plurality of the gate structures 50, a plurality of the first doped regions 22, a plurality of the second doped regions 24, and a plurality of the third doped regions 32. Each of the gate structures 50 may extend in the second horizontal direction D2, the third doped regions 32 and the fourth doped region 34 may be located between two gate structures 50, and two first doped regions 22 and two second doped regions 24 may be located at the relative outer sides of the two gate structures 50 in the first horizontal direction D1. In some embodiments, the structure illustrated in FIG. 3 may be regarded as a structure including two MOS structures sharing one fourth doped region 34, but not limited thereto. In some embodiments, each of the first doped regions 22 and each of the third doped regions 32 may extend in the second horizontal direction D2, respectively, and each of the third doped regions 32 may be located between the corresponding gate structure 50 and the contact structure CT4 in the first horizontal direction D1, but not limited thereto. Additionally, the isolation structure 40 may surround the second doped regions 24 and the fourth doped region 34, and the isolation structure 40 may be disposed between the doped region 26 and the second doped region 24 and disposed between the doped region 26 and the fourth doped region 34. It is worth noting that the layout design of the electrostatic discharge protection structure 101 is not limited to the condition shown in FIG. 3 and may be further modified according to some design considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 4:
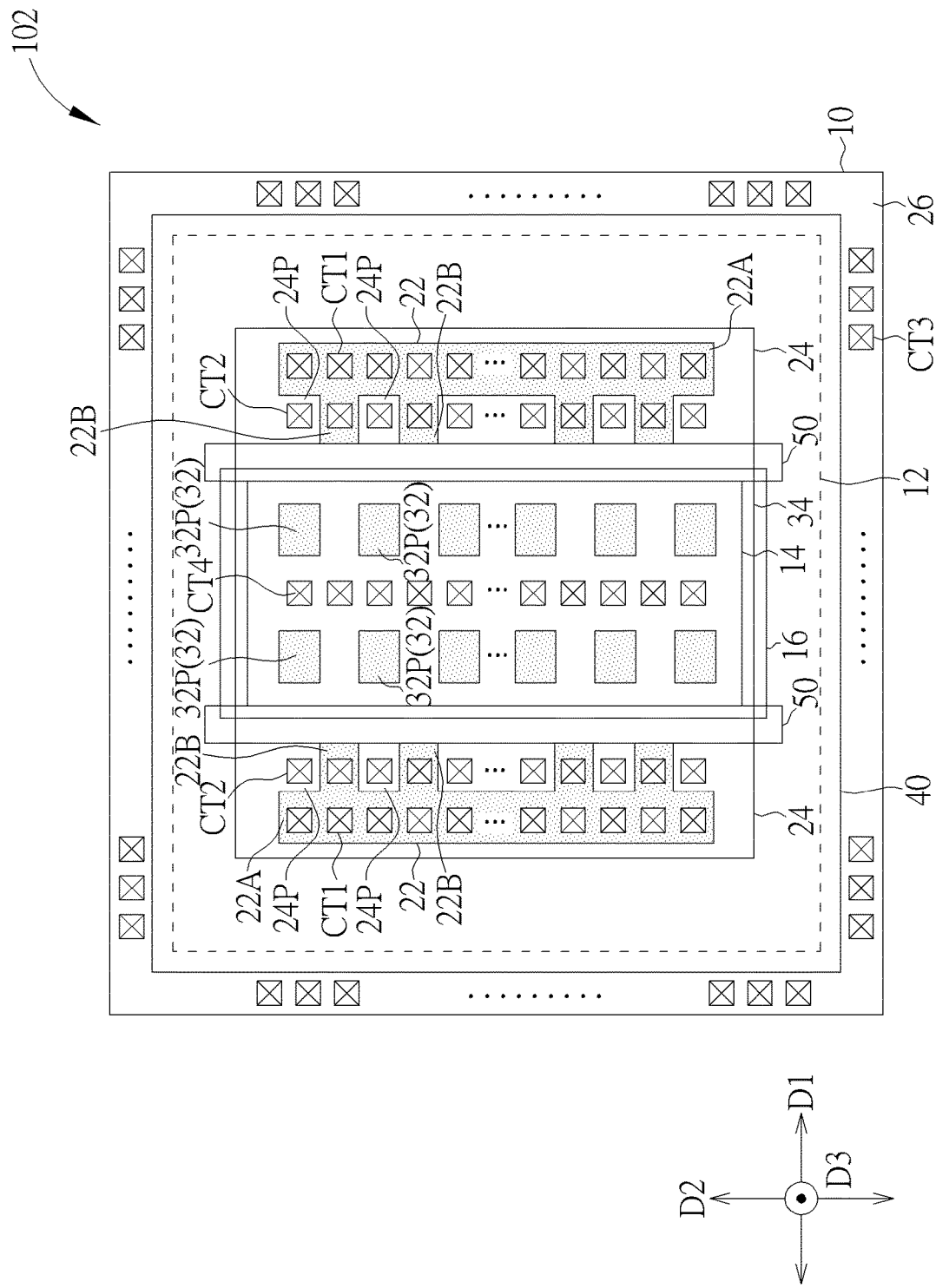
FIG. 4 is a schematic drawing illustrating a top view of an electrostatic discharge protection structure according to a second embodiment of the present invention.

Please refer to FIG. 4. FIG. 4 is a schematic drawing illustrating a top view of an electrostatic discharge protection structure 102 according to a second embodiment of the present invention. As shown in FIG. 4, in some embodiments, each of the first doped regions 22 may include a first portion 22A and a plurality of second portions 22B. Each of the second portions 22B is directly connected with the first portion 22A, each of the second portions 22B is located between the first portion 22A and the fourth doped region 34 in the first horizontal direction D1, and the second portions 22B are repeatedly arranged in the second horizontal direction D2. In some embodiments, the first portion 22A may extend in the second horizontal direction D2, and each of the second portions 22B may be regarded as a protruding portion extending towards the gate structure 50 in the first horizontal direction D1, but not limited thereto. Additionally, the second doped region 24 disposed between the first portion 22A and the gate structure 50 in the first horizontal direction D1 may include a plurality of first sub portions 24P. Each of the first sub portions 24P may be located between the first portion 22A and the fourth doped region 34 in the first horizontal direction D1, and the first sub portions 24P and the second portions 22B may be alternately arranged in the second horizontal direction D2. Additionally, the third doped region 32 may include a plurality of second sub portions 32P arranged in the second horizontal direction D2 and separated from one another, and each of the second sub portions 32P may be disposed corresponding to and substantially aligned with one of the first sub portions 24P in the first horizontal direction D1.

By the allocation described above, the area occupied by the second doped region 24 at the anode terminal or the cathode terminal may be relatively reduced (compared with the electrostatic discharge protection structure in the first embodiment described above, such as the condition illustrated in FIG. 3) in the electrostatic discharge protection structure 102 of this embodiment by the disposition of the second portions 22B of the first doped region 22, and the emitter injection efficiency of the bipolar junction transistor corresponding to the second doped region 24 may be further lowered accordingly. In addition, the third doped region 32 may be divided into the second sub portions 32P separated from one another for being located corresponding to the first sub portions 24P separated from one another in the first horizontal direction D1. Therefore, the area occupied by the third doped region 32 at the anode terminal or the cathode terminal may be relatively reduced, and the emitter injection efficiency of the bipolar junction transistor corresponding to the third doped region 32 may be further lowered accordingly. In other words, by the disposition approach described above, the emitter injection efficiency of the parasite bipolar junction transistor in the electrostatic discharge protection structure 102 may be lowered, and the holding voltage and/or other related electrical performance of the electrostatic discharge protection structure may be enhanced. In some embodiments, an area of each of the second portions 22B in the vertical direction Z may be greater than or equal to an area of each of the first sub portions 24P in the vertical direction Z, but not limited thereto. For example, in some embodiments, the area of each of the second portions 22B in the vertical direction Z may be substantially equal to the area of each of the first sub portions 24P in the vertical direction Z, and the length of each of the second sub portions 32P in the second horizontal direction D2, the length of each of the first sub portions 24P in the second horizontal direction D2, and the length of each of the second portions 22B in the second horizontal direction D2 may be substantially equal to one another, but not limited thereto. Additionally, in some embodiments, the corresponding contact structure CT1 and the corresponding contact structure CT2 may be disposed on each of the second portions 22B and each of the first sub portions 24P, respectively, and there is not any contact structure disposed on and directly contacting the second sub portions 32P, but not limited thereto.

Figure 5:
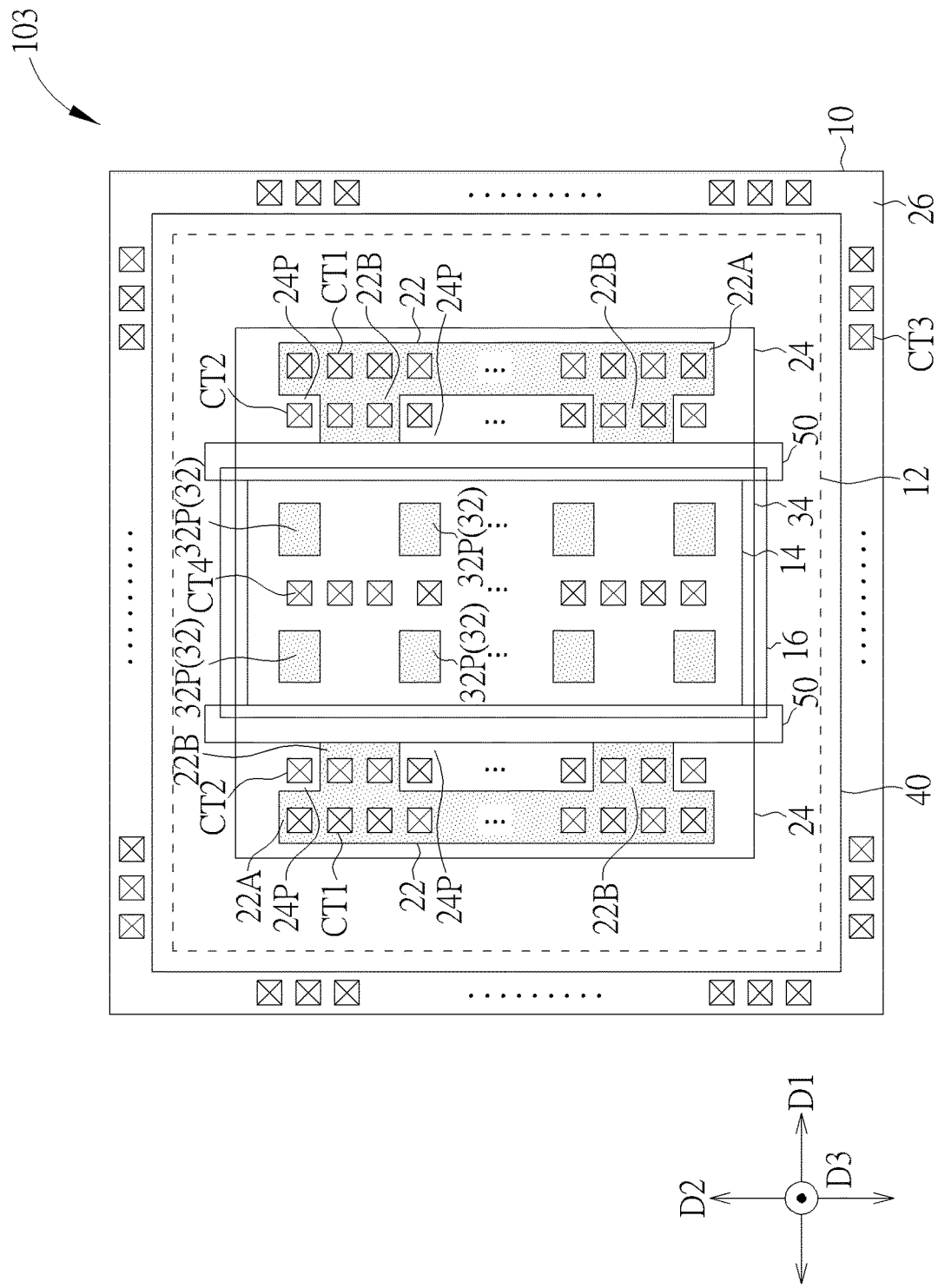
FIG. 5 is a schematic drawing illustrating a top view of an electrostatic discharge protection structure according to a third embodiment of the present invention.
Figure 6:
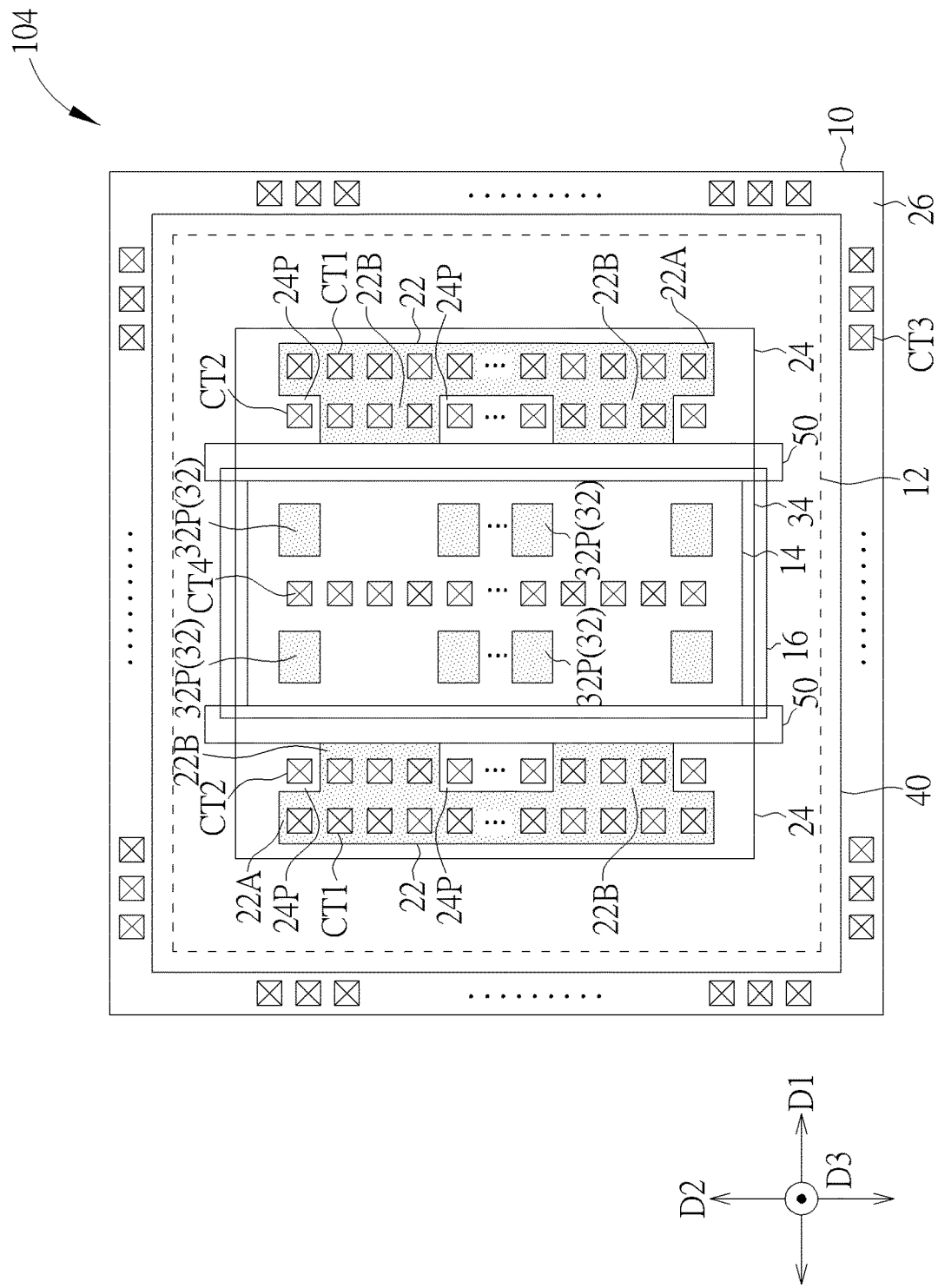
FIG. 6 is a schematic drawing illustrating a top view of an electrostatic discharge protection structure according to a fourth embodiment of the present invention.

Please refer to FIG. 5 and FIG. 6. FIG. 5 is a schematic drawing illustrating a top view of an electrostatic discharge protection structure 103 according to a third embodiment of the present invention, and FIG. 6 is a schematic drawing illustrating a top view of an electrostatic discharge protection structure 104 according to a fourth embodiment of the present invention. As shown in FIG. 5 and FIG. 6, in some embodiments, the area of each of the second portions 22B in the vertical direction D3 may be greater than the area of each of the first sub portions 24P in the vertical direction D3 for further reducing the area occupied by the second doped region 24 and further lowering the emitter injection efficiency of the bipolar junction transistor corresponding to the second doped region 24. In addition, because the area of the second portions 22B is increased, the spacing between the second sub portions 32P disposed corresponding to the first sub portions 24P may be increased accordingly, and the area occupied by the third doped region 32 may be further reduced for lowering the emitter injection efficiency of the bipolar junction transistor corresponding to the third doped region 32. For example, in some embodiments, the length of each of the second portions 22B in the second horizontal direction D2 may be substantially twice the length of each of the first sub portions 24P in the second horizontal direction D2 (such as the condition shown in FIG. 5), the length of each of the second portions 22B in the second horizontal direction D2 may be substantially triple the length of each of the first sub portions 24P in the second horizontal direction D2 (such as the condition shown in FIG. 6), or other suitable proportion of the length of each of the second portions 22B to the length of each of the first sub portions 24P may be applied, and the length of each of the second sub portions 32P in the second horizontal direction D2 may be substantially equal to the length of each of the first sub portions 24P in the second horizontal direction D2, but not limited thereto. Additionally, it is worth noting that the first portion 22A and the second portions 22B of the first doped region 22, the first sub portions 24P of the second doped region 24, and/or the second sub portions 32P of the third doped region 32 illustrated in FIGS. 4-6 described above may also be applied in other embodiments of the present inventions according to some design considerations.

Figure 7:
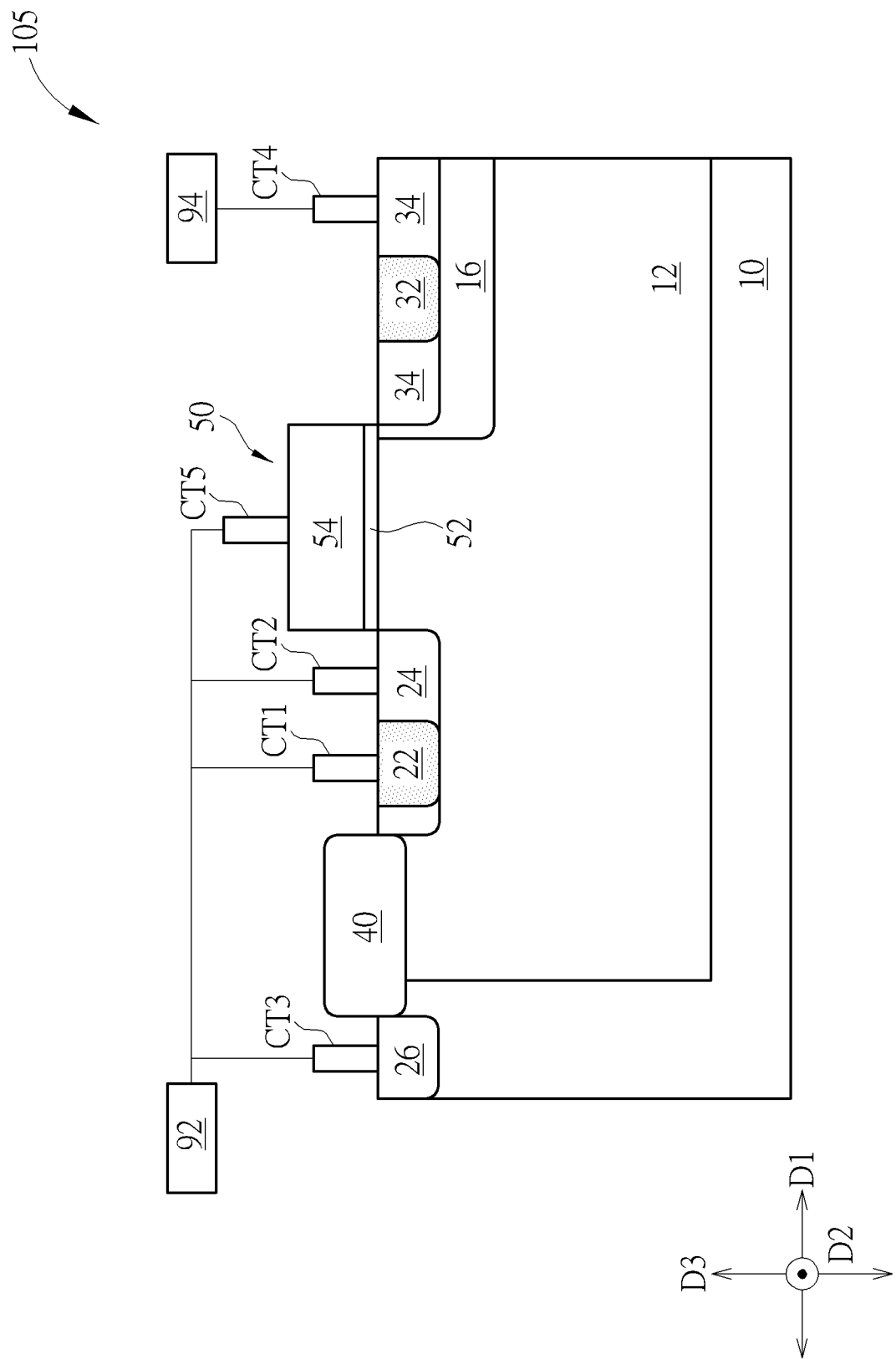
FIG. 7 is a schematic drawing illustrating an electrostatic discharge protection structure according to a fifth embodiment of the present invention.

Please refer to FIG. 7 and FIG. 1. FIG. 7 is a schematic drawing illustrating an electrostatic discharge protection structure 105 according to a fifth embodiment of the present invention. As shown in FIG. 7, the third well region 16 described above may be disposed in the electrostatic discharge protection structure 105 without the second well region in the first embodiment described above (such as the second well region 14 illustrated in FIG. 1). In the electrostatic discharge protection structure 105, the second doped region 24, the first well region 12, and the third well region 16 may form the first bipolar junction transistor described above, and the third doped region 32, the third well region 16, and the first well region 12 may form the second bipolar junction transistor described above, but not limited thereto. It is worth noting that the design where the third well region 16 is disposed in the electrostatic discharge protection structure without disposing the second well region as shown in FIG. 7 may also be applied in other embodiments of the present inventions according to some considerations.

Figure 8:
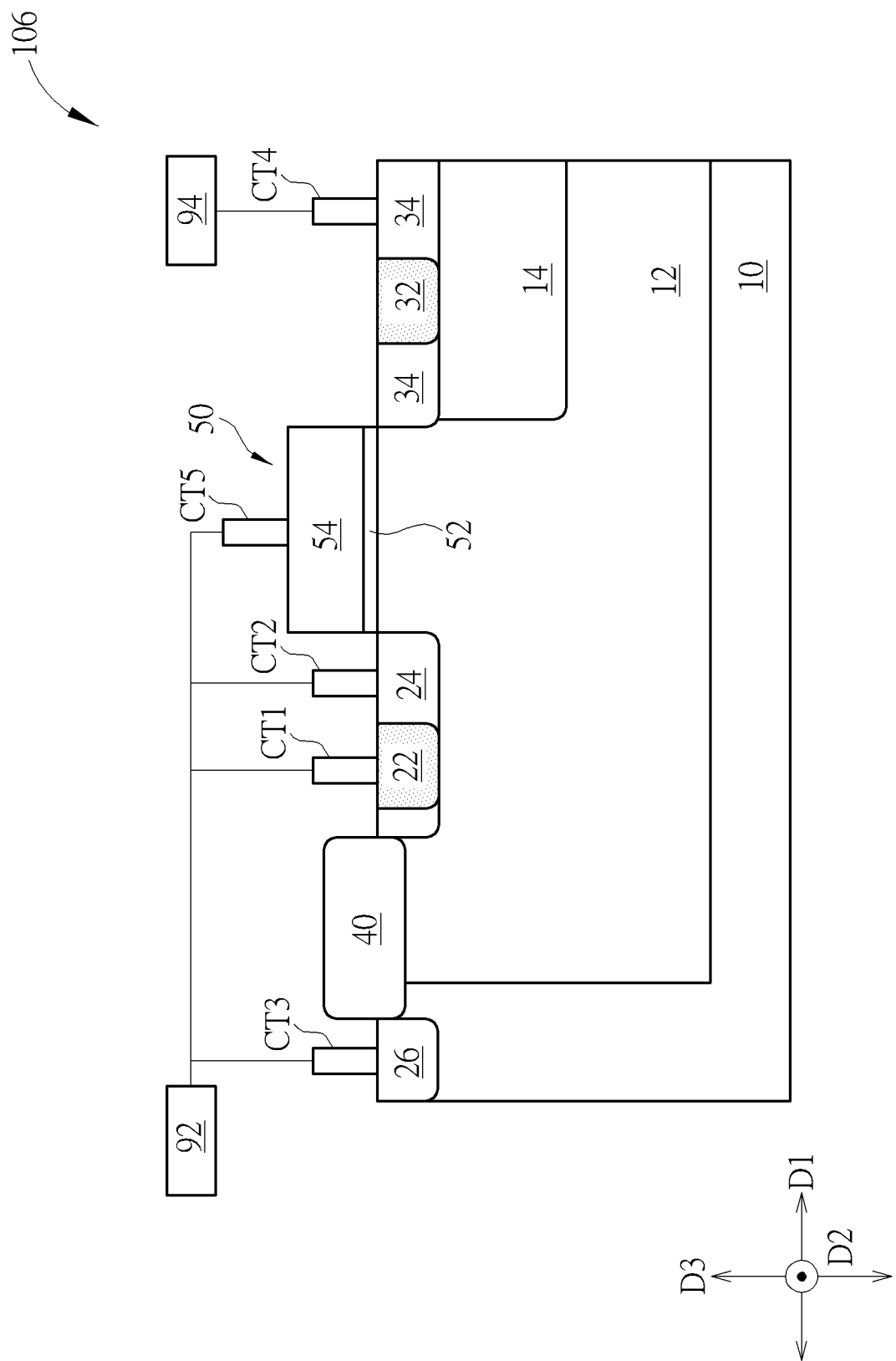
FIG. 8 is a schematic drawing illustrating an electrostatic discharge protection structure according to a sixth embodiment of the present invention.

Please refer to FIG. 8 and FIG. 1. FIG. 8 is a schematic drawing illustrating an electrostatic discharge protection structure 106 according to a sixth embodiment of the present invention. As shown in FIG. 8, the second well region 14 described above may be disposed in the electrostatic discharge protection structure 106 without the third well region in the first embodiment described above (such as the third well region 16 illustrated in FIG. 1). In the electrostatic discharge protection structure 106, the second doped region 24, the first well region 12, and the second well region 14 may form the first bipolar junction transistor described above, and the third doped region 32, the second well region 14, and the first well region 12 may form the second bipolar junction transistor described above, but not limited thereto. It is worth noting that the design of FIG. 8 with the second well region 14 disposed in the electrostatic discharge protection structure and without the third well region may also be applied in other embodiments of the present inventions according to some considerations.

Figure 9:
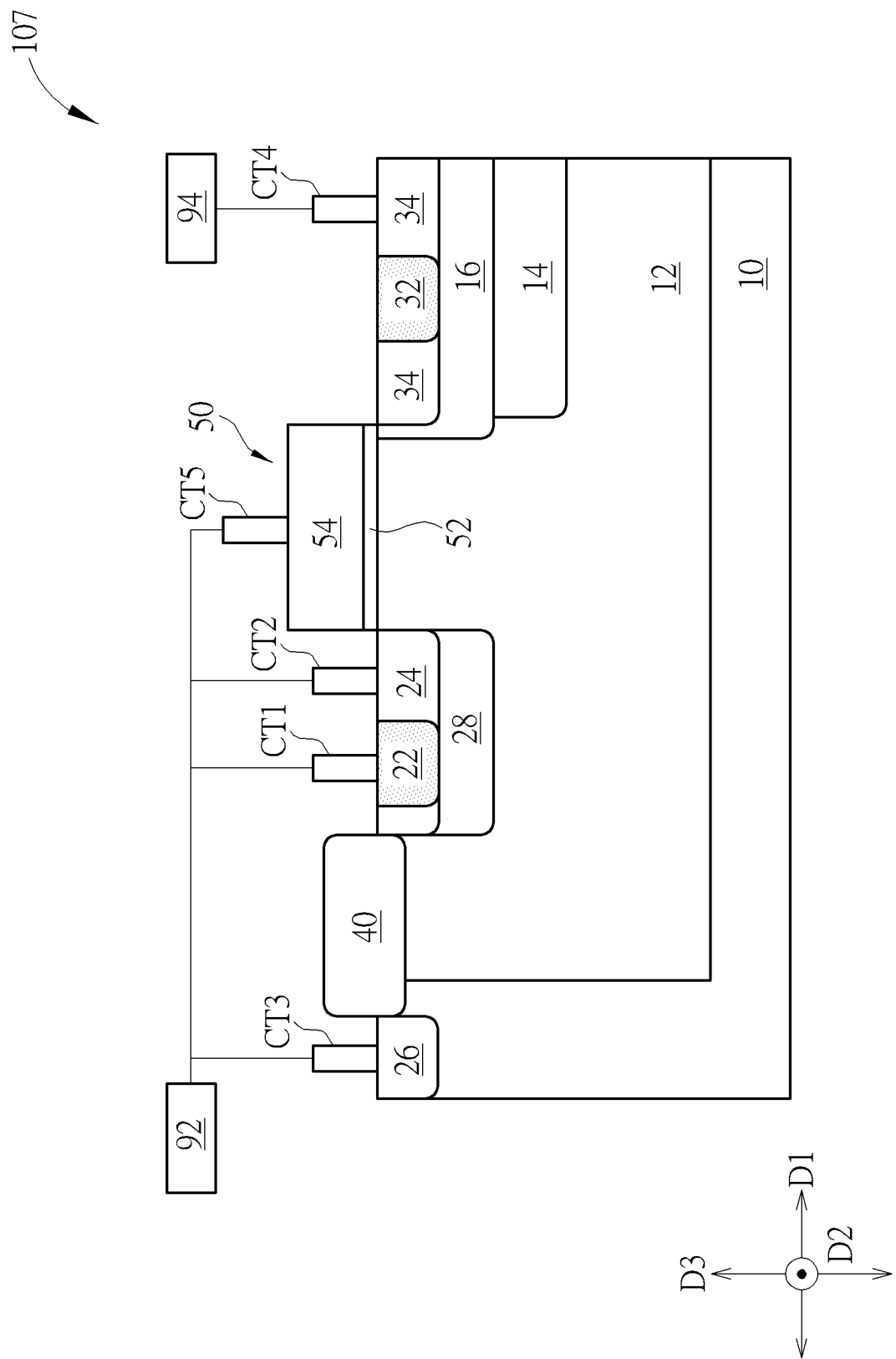
FIG. 9 is a schematic drawing illustrating an electrostatic discharge protection structure according to a seventh embodiment of the present invention.

Please refer to FIG. 9. FIG. 9 is a schematic drawing illustrating an electrostatic discharge protection structure 107 according to a seventh embodiment of the present invention. As shown in FIG. 9, in some embodiments, the electrostatic discharge protection structure 107 may further include a fifth doped region 28 of the first conductivity type disposed in the first well region 12, and the first doped region 22 and the second doped region 24 may be located above the fifth doped region 28 in the vertical direction D3. In some embodiments, the fifth doped region 28 may be regarded as an electrostatic discharge doped region for adjusting the breakdown voltage of the corresponding bipolar junction transistor and/or further lowering the emitter injection efficiency of the corresponding bipolar junction transistor. For instance, the dopant concentration and/or the depth of the fifth doped region 28 may be adjusted for achieving the effects described above, but not limited thereto. Additionally, the fifth doped region 28 may be regarded as a P type electrostatic discharge (PESD) doped region when the first conductivity type is P type, and the fifth doped region 28 may be regarded as an N type electrostatic discharge (NESD) doped region when the first conductivity type is N type, but not limited thereto. In some embodiments, the dopant concentration in the fifth doped region 28 may vary with gradient in a specific direction (such as in the vertical direction D3, but not limited thereto. It is worth noting that the fifth doped region 28 illustrated in FIG. 9 may also be applied in other embodiments of the present inventions according to some design considerations.

Figure 10:
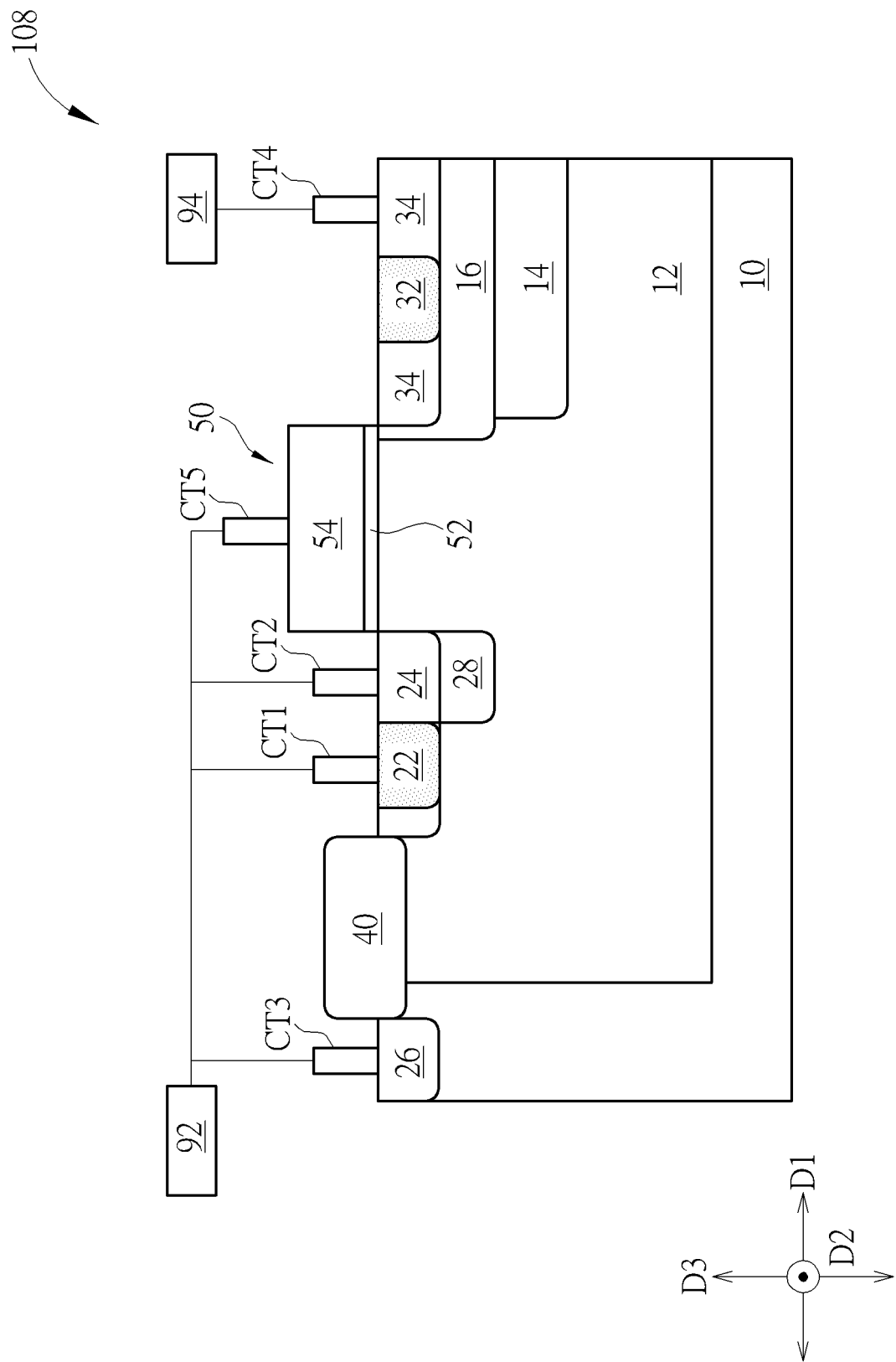
FIG. 10 is a schematic drawing illustrating an electrostatic discharge protection structure according to an eighth embodiment of the present invention.

Please refer to FIG. 10. FIG. 10 is a schematic drawing illustrating an electrostatic discharge protection structure 108 according to an eighth embodiment of the present invention. As shown in FIG. 10, in some embodiments, the fifth doped region 28 may be disposed under the second doped region 24 in the vertical direction D3, and the first doped region 22 may not be disposed above the fifth doped region 28 in the vertical direction D3. In other words, the dopant concentration of the fifth doped region 28, the depth of the fifth doped region 28, and the relative position relationship between the fifth doped region 28 and other doped regions may be adjusted according to some design considerations. For instance, the fifth doped region 28 may cover at least a part of the second doped region 24 in the vertical direction D3, or the e fifth doped region 28 may cover the first doped region 22 and the second doped region 24 in the vertical direction D3 (such as the condition illustrated in FIG. 9), but not limited thereto.

Figure 11:
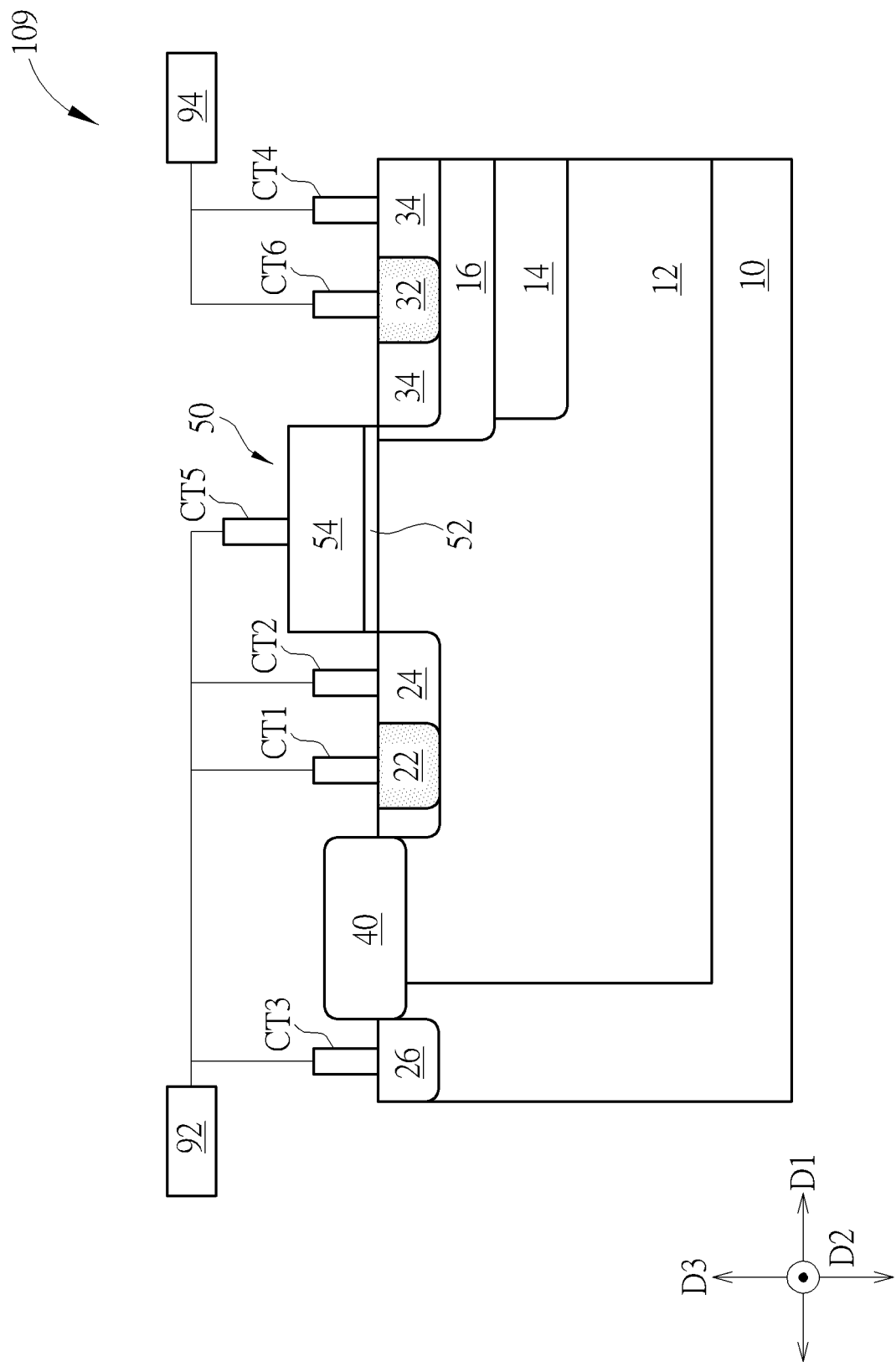
FIG. 11 is a schematic drawing illustrating an electrostatic discharge protection structure according to a ninth embodiment of the present invention.

Please refer to FIG. 11. FIG. 11 is a schematic drawing illustrating an electrostatic discharge protection structure 109 according to a ninth embodiment of the present invention. As shown in FIG. 11, in the electrostatic discharge protection structure 109, the third doped region 32 may be electrically connected to the second electrode 94 via one or a plurality of contact structures CT6 disposed on the third doped region 32, and the diode described above may not be formed between the third doped region 32 and the fourth doped region 34 when the fourth doped region 34 is electrically connected to the second electrode 94 via the contact structure CT4, but not limited thereto. It is worth noting that the design where the third doped region 32 and the fourth doped region 34 are electrically connected to the second electrode 94 via the contact structure CT6 and the contact structure CT4, respectively, as shown in FIG. 11 may also be applied in other embodiments of the present inventions according to some considerations.

Figure 12:
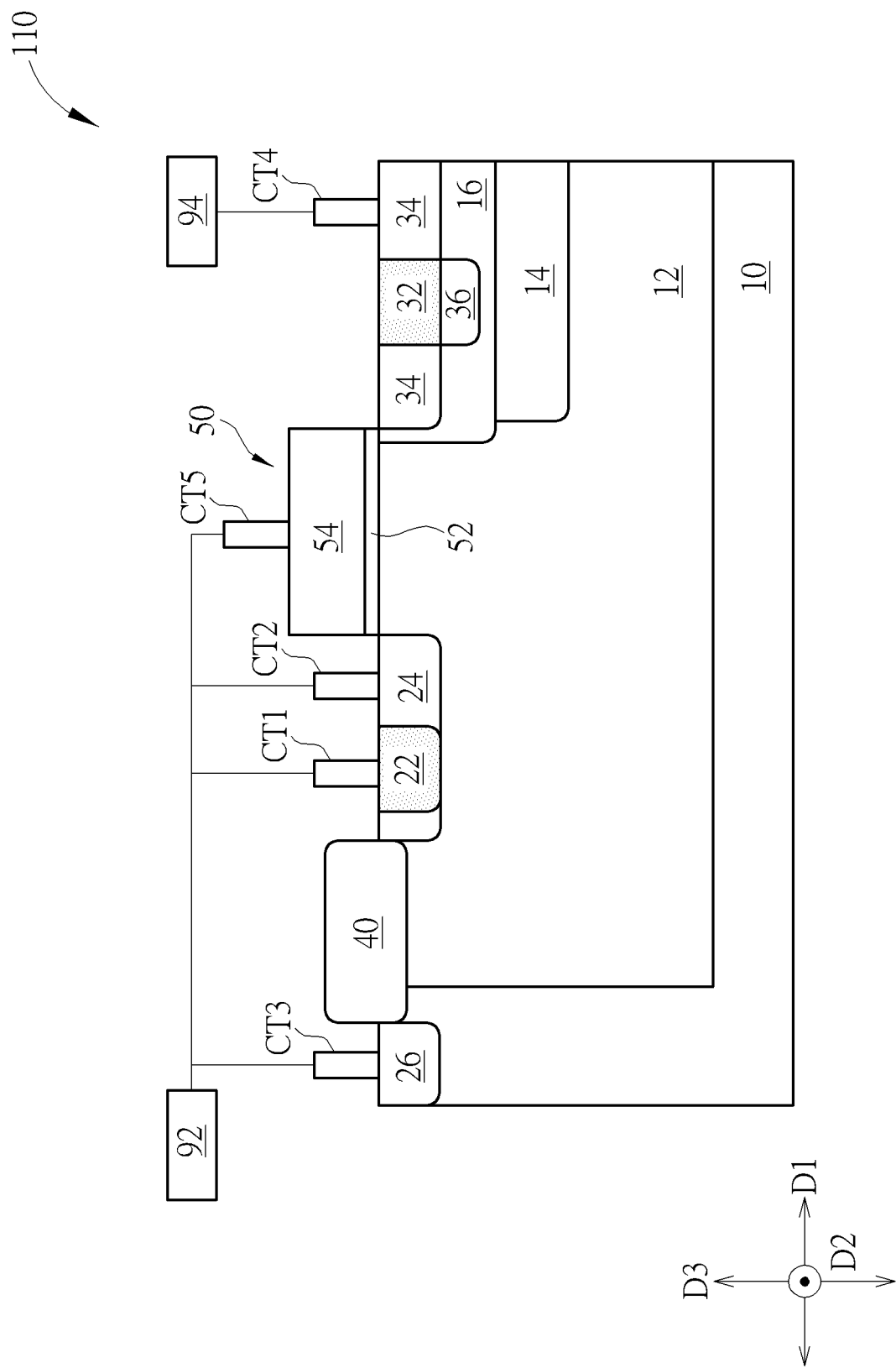
FIG. 12 is a schematic drawing illustrating an electrostatic discharge protection structure according to a tenth embodiment of the present invention.

Please refer to FIG. 12. FIG. 12 is a schematic drawing illustrating an electrostatic discharge protection structure 110 according to a tenth embodiment of the present invention. As shown in FIG. 12, in some embodiments, the electrostatic discharge protection structure 110 may further include a sixth doped region 36 of the first conductivity type disposed in the first well region 12, and the third doped region 32 may be located above the sixth doped region 36 in the vertical direction D3. In some embodiments, the sixth doped region 36 may be regarded as an electrostatic discharge doped region for adjusting the breakdown voltage of the corresponding bipolar junction transistor and/or further lowering the emitter injection efficiency of the corresponding bipolar junction transistor. For instance, the dopant concentration and/or the depth of the sixth doped region 36 may be adjusted for achieving the effects described above, but not limited thereto. Additionally, the sixth doped region 36 may be regarded as a PESD doped region when the first conductivity type is P type, and the sixth doped region 36 may be regarded as an NESD doped region when the first conductivity type is N type, but not limited thereto. It is worth noting that the sixth doped region 36 illustrated in FIG. 12 may also be applied in other embodiments of the present inventions according to some design considerations.

Figure 13:
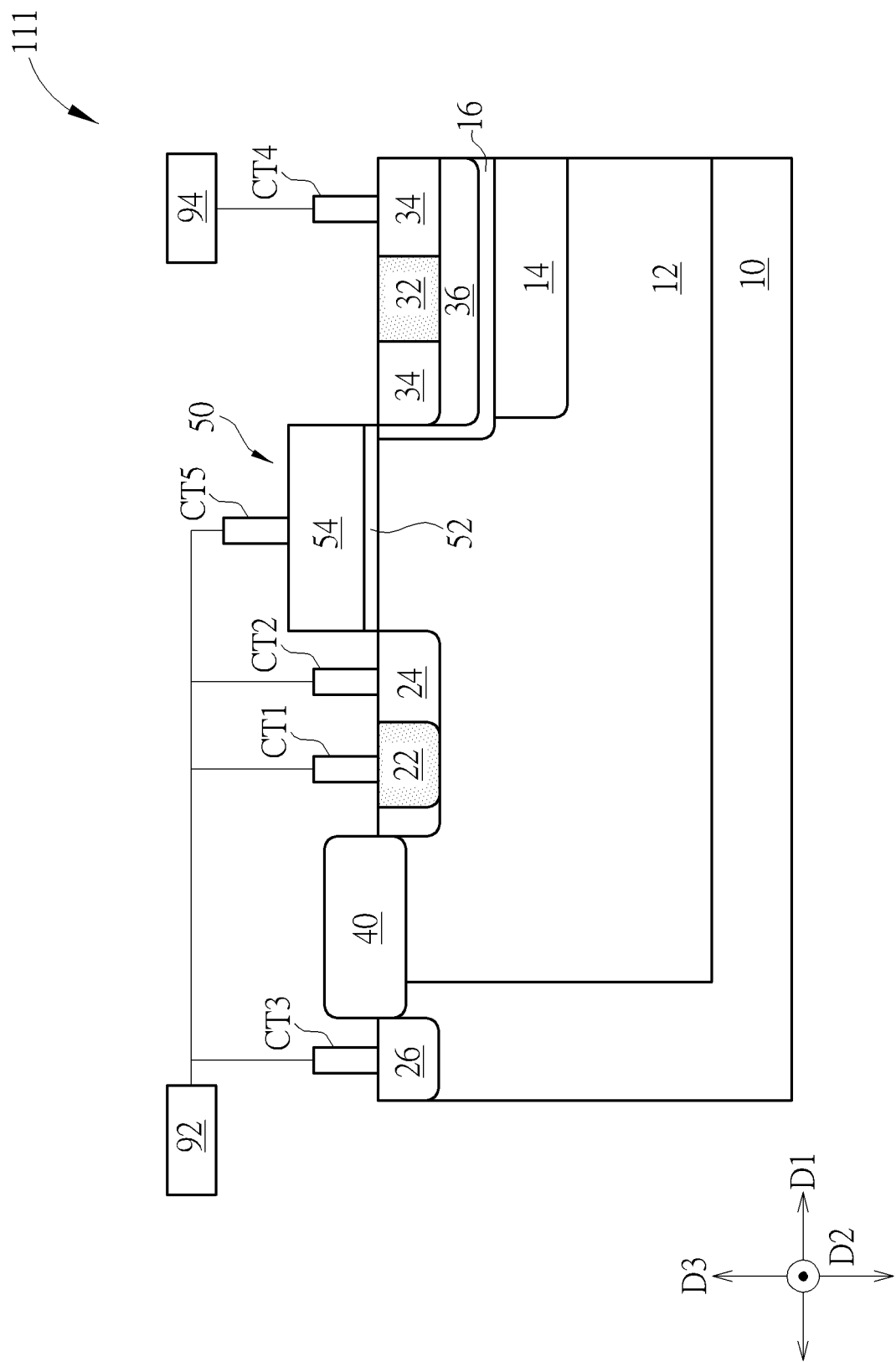
FIG. 13 is a schematic drawing illustrating an electrostatic discharge protection structure according to an eleventh embodiment of the present invention.

Please refer to FIG. 13. FIG. 13 is a schematic drawing illustrating an electrostatic discharge protection structure 111 according to an eleventh embodiment of the present invention. As shown in FIG. 13, in some embodiments, the sixth doped region 36 may be disposed under the third doped region 32 and the fourth doped region 34 in the vertical direction D3. Therefore, the third doped region 32 and the fourth doped region 34 may be located above the sixth doped region 36 in the vertical direction D3. In other words, the dopant concentration of the sixth doped region 36, the depth of the sixth doped region 36, and the relative position relationship between the sixth doped region 36 and other doped regions may be adjusted according to some design considerations. For instance, the sixth doped region 36 may cover the third doped region 32 and the fourth doped region 34 in the vertical direction D3, or the sixth doped region 36 may only cover the third doped region 32 in the vertical direction D3 (such as the condition illustrated in FIG. 12), but not limited thereto. In some embodiments, a diode may be formed between the sixth doped region 36 and the fourth doped region 34, but not limited thereto.

Figure 14:
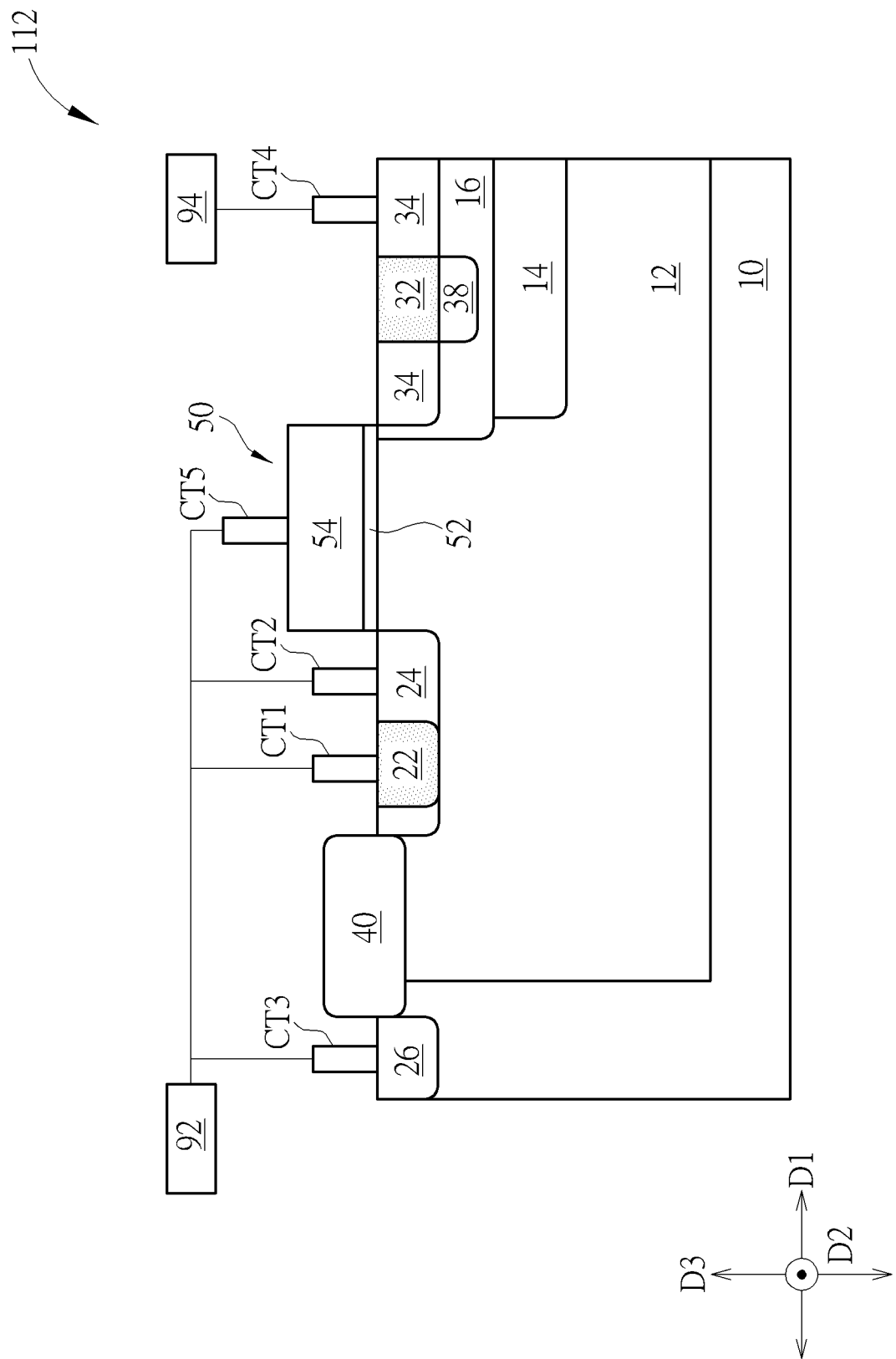
FIG. 14 is a schematic drawing illustrating an electrostatic discharge protection structure according to a twelfth embodiment of the present invention.

Please refer to FIG. 14. FIG. 14 is a schematic drawing illustrating an electrostatic discharge protection structure 112 according to a twelfth embodiment of the present invention. As shown in FIG. 14, in some embodiments, the electrostatic discharge protection structure 112 may further include a seventh doped region 38 of the second conductivity type disposed in the first well region 12, and the third doped region 32 may be located above the seventh doped region 38 in the vertical direction D3. In some embodiments, the seventh doped region 38 may be regarded as an electrostatic discharge doped region for adjusting the breakdown voltage of the corresponding bipolar junction transistor and/or further lowering the emitter injection efficiency of the corresponding bipolar junction transistor. For instance, the dopant concentration and/or the depth of the seventh doped region 38 may be adjusted for achieving the effects described above, but not limited thereto. Additionally, the seventh doped region 38 may be regarded as an NESD doped region when the second conductivity type is N type, and the seventh doped region 38 may be regarded as a PESD doped region when the second conductivity type is P type, but not limited thereto. In some embodiments, at least a part of the seventh doped region 38 may be disposed in the third well region 16 and/or the second well region 14, but not limited thereto. It is worth noting that the seventh doped region 38 illustrated in FIG. 14 may also be applied in other embodiments of the present inventions according to some design considerations.

Figure 15:
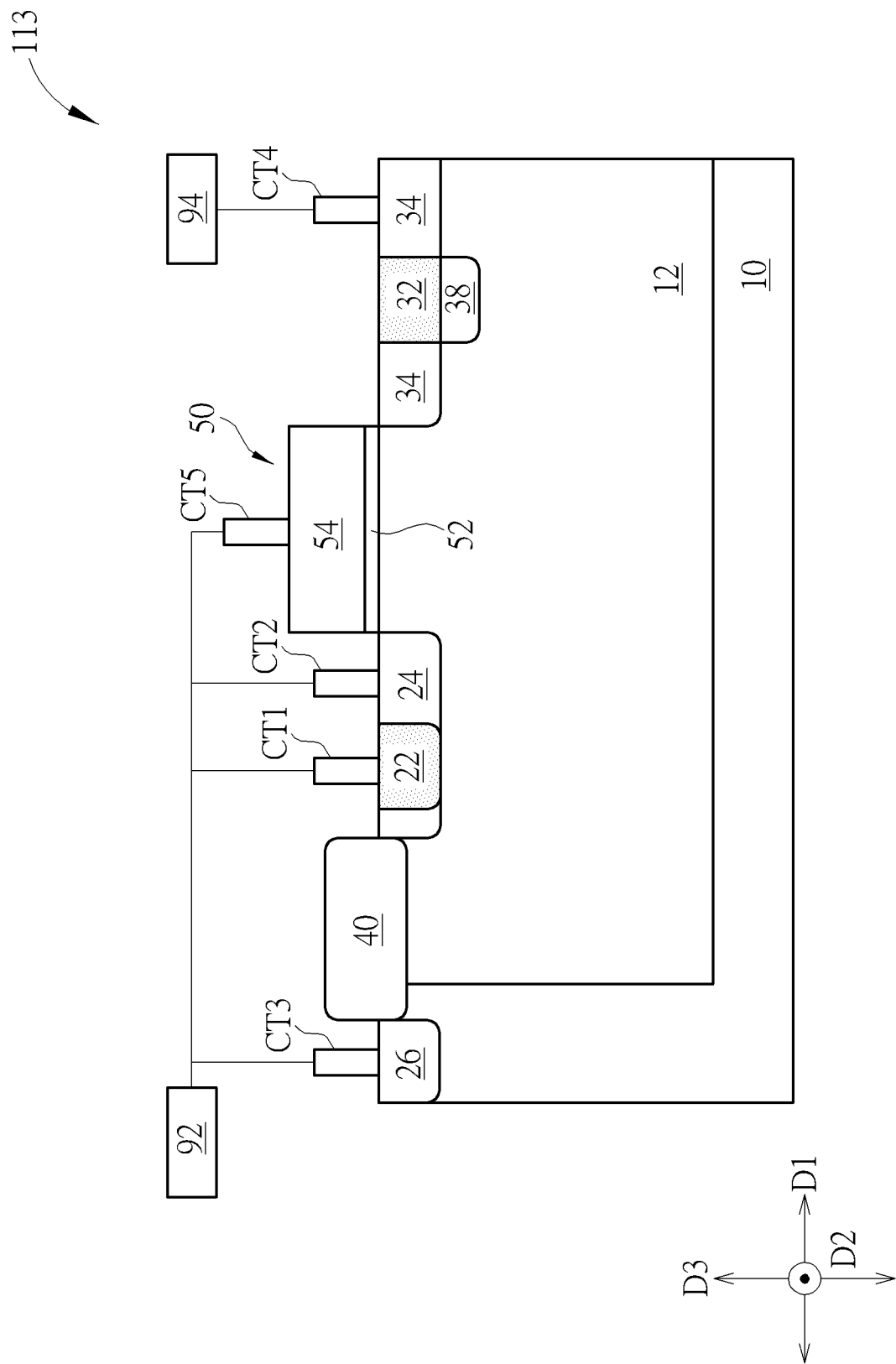
FIG. 15 is a schematic drawing illustrating an electrostatic discharge protection structure according to a thirteenth embodiment of the present invention.

Please refer to FIG. 15. FIG. 15 is a schematic drawing illustrating an electrostatic discharge protection structure 113 according to a thirteenth embodiment of the present invention. As shown in FIG. 15, in some embodiments, the seventh doped region 38 described above may be disposed in the electrostatic discharge protection structure 113 without disposing the second well region and the third well region in the first embodiment described above (such as the second well region 14 and the third well region 16 illustrated in FIG. 1). In the electrostatic discharge protection structure 113, the second bipolar junction transistor described above may be formed with the third doped region 32, the seventh doped region 38, and the first well region 12, but not limited thereto. It is worth noting that the design where the seventh doped region 38 is disposed in the electrostatic discharge protection structure without disposing the first well region and the second well region as shown in FIG. 15 may also be applied in other embodiments of the present inventions according to some considerations.

Figure 16:
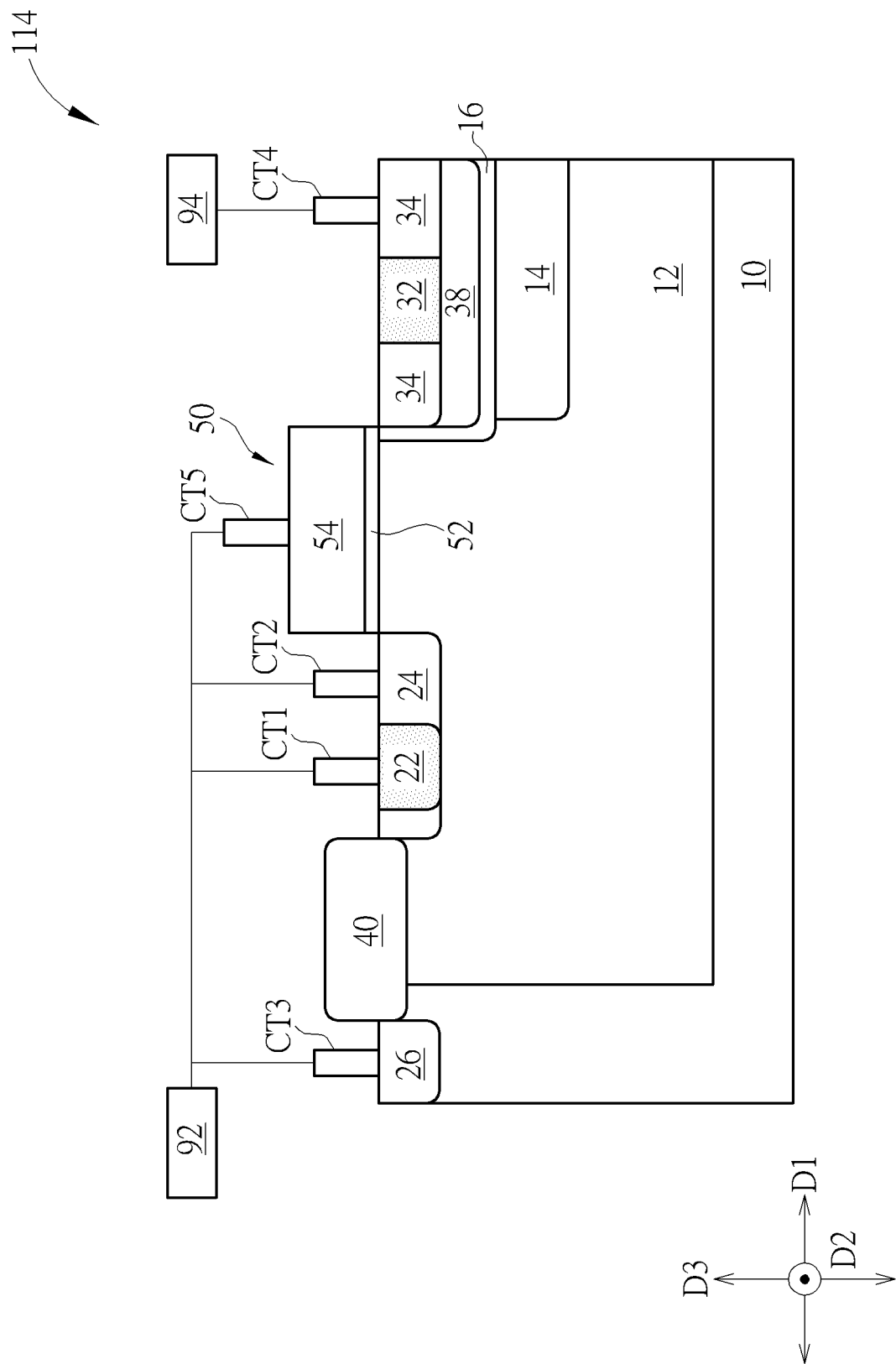
FIG. 16 is a schematic drawing illustrating an electrostatic discharge protection structure according to a fourteenth embodiment of the present invention.

Please refer to FIG. 16. FIG. 16 is a schematic drawing illustrating an electrostatic discharge protection structure 114 according to a fourteenth embodiment of the present invention. As shown in FIG. 16, in some embodiments, the third doped region 32 and the fourth doped region 34 may be located above the seventh doped region 38 in the vertical direction D3, and the seventh doped region 38 may cover the third doped region 32 and the fourth doped region 34 in the vertical direction D3, but not limited thereto. It is worth noting that the design where the seventh doped region 38 covers the third doped region 32 and the fourth doped region 34 as shown in FIG. 16 may also be applied in other embodiments of the present inventions according to some considerations.

Figure 17:
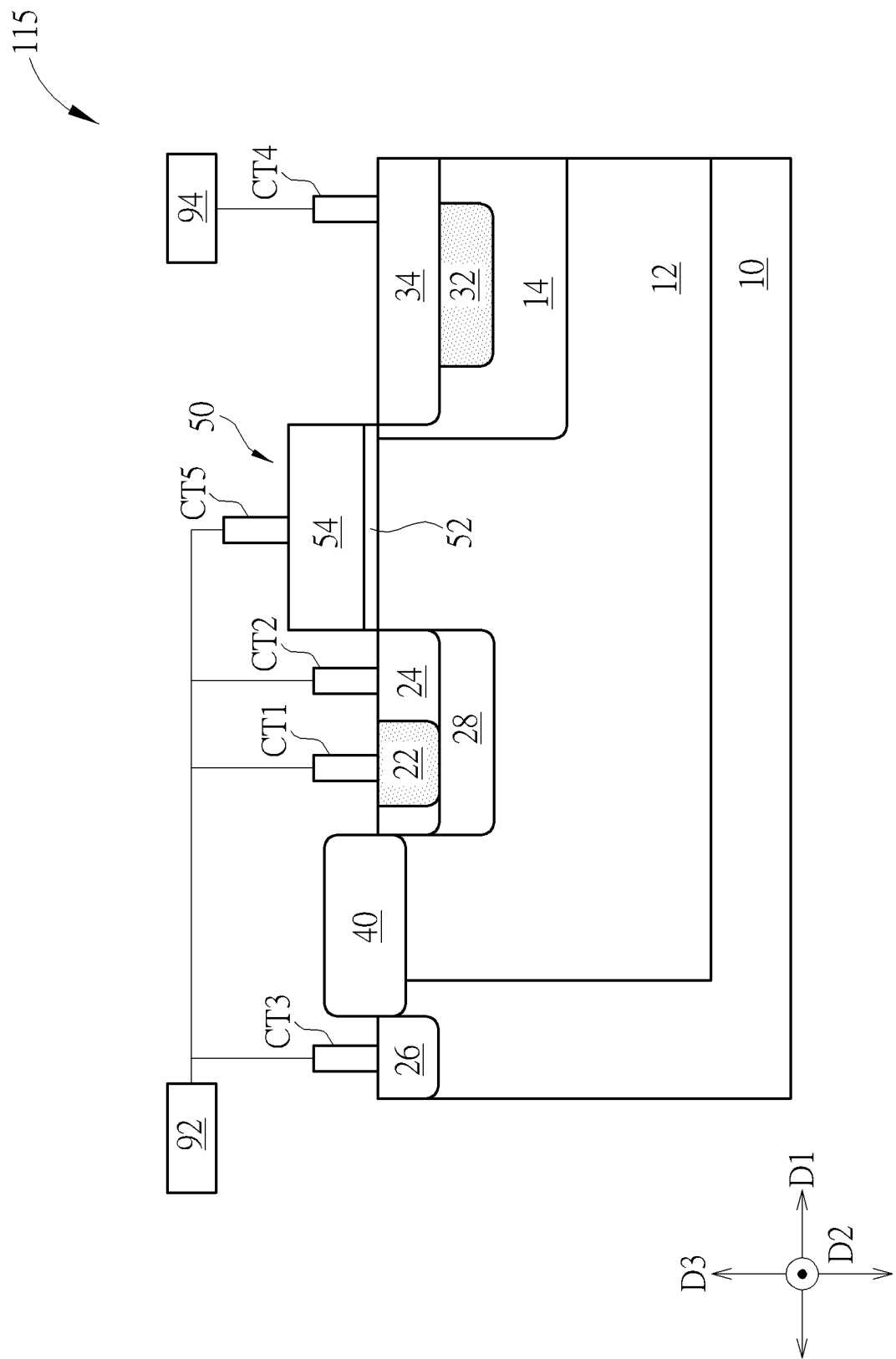
FIG. 17 is a schematic drawing illustrating an electrostatic discharge protection structure according to a fifteenth embodiment of the present invention.

Please refer to FIG. 17. FIG. 17 is a schematic drawing illustrating an electrostatic discharge protection structure 115 according to a fifteenth embodiment of the present invention. As shown in FIG. 17, in some embodiments, the third doped region 32 may be located under the fourth doped region 34 in the vertical direction D3, the diode described above may be formed between the third doped region 32 and the fourth doped region 34, and the diode may be regarded as a vertical parasitic reverse diode, but not limited thereto. In some embodiments, the second well region 14 may be located under the third doped region 32 and the fourth doped region 34 in the vertical direction D3. In some embodiments, the third well region described above may be disposed between the second well region 14 and the third doped region 32 and disposed between the second well region 14 and the fourth doped region 34, or the second well region 14 in FIG. 16 may be replaced by the third well region. In addition, the first doped region 22 and the second doped region 24 may be located above the fifth doped region 28 in the vertical direction D3, and the fifth doped region 28 may cover the first doped region 22 and the second doped region 24 in the vertical direction D3, but not limited thereto. In some embodiments, the fifth doped region 28 may be disposed under the second doped region 24 in the vertical direction D3 only (such as the condition shown in FIG. 10), but not limited thereto. It is worth noting that the design where the third doped region 32 is disposed under the fourth doped region 34 in the vertical direction D3 as shown in FIG. 17 may also be applied in other embodiments of the present inventions according to some considerations.

To summarize the above descriptions, according to the electrostatic discharge protection structure in the present invention, the doped regions of different conductivity types may be connected with doped regions used as the emitters of bipolar junction transistors for reducing the emitter injection efficiency and enhancing the holding voltage and/or other related electrical performance of the electrostatic discharge protection structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge protection structure, comprising:
    a semiconductor substrate;
    a gate structure disposed on the semiconductor substrate;
    a first well region of a first conductivity type disposed in the semiconductor substrate;
    a first doped region of the first conductivity type disposed in the first well region;
    a second doped region of a second conductivity type disposed in the first well region, wherein the second doped region is connected with the first doped region, and the second doped region is an emitter of a first bipolar junction transistor;
    a third doped region of the first conductivity type disposed in the semiconductor substrate, wherein the third doped region and the second doped region are located at two opposite sides of the gate structure in a first horizontal direction; and
    a fourth doped region of the second conductivity type disposed in the semiconductor substrate, wherein the fourth doped region is connected with the third doped region, and the third doped region is an emitter of a second bipolar junction transistor,
    wherein the second doped region surrounds the first doped region in the first horizontal direction.

2. The electrostatic discharge protection structure according to claim 1, wherein the second doped region directly contacts the first doped region, and the fourth doped region directly contacts the third doped region.

3. The electrostatic discharge protection structure according to claim 1, further comprising:
    a second well region of the second conductivity type disposed in the first well region, wherein the third doped region and the fourth doped region are located above the second well region in a vertical direction.

4. The electrostatic discharge protection structure according to claim 3, wherein the second well region, the first well region, and the second doped region form the first bipolar junction transistor, and the third doped region, the second well region and the first well region form the second bipolar junction transistor.

5. The electrostatic discharge protection structure according to claim 3, further comprising:
    a third well region of the second conductivity type disposed in the first well region, wherein the third well region is located between the third doped region and the second well region in the vertical direction, and a dopant concentration in the third well region is lower than a dopant concentration in the fourth doped region and higher than a dopant concentration in the second well region.

6. The electrostatic discharge protection structure according to claim 1, wherein a diode is formed between the third doped region and the fourth doped region, the fourth doped region is electrically connected to an electrode, the third doped region is not-electrically directly connected to the electrode, and the diode is electrically connected to the second bipolar junction transistor.

7. The electrostatic discharge protection structure according to claim 1, wherein a part of the second doped region is located between the first doped region and the gate structure in the first horizontal direction, and a part of the fourth doped region is located between the third doped region and the gate structure in the first horizontal direction.

8. The electrostatic discharge protection structure according to claim 1, wherein the fourth doped region surrounds the third doped region in the first horizontal direction.

9. The electrostatic discharge protection structure according to claim 1, wherein the first doped region comprises:
    a first portion extending in a second horizontal direction; and
    second portions connected with the first portion and located between the first portion and the fourth doped region in the first horizontal direction, wherein the second portions are repeatedly arranged in the second horizontal direction.

10. The electrostatic discharge protection structure according to claim 9, wherein the second doped region comprises:
    first sub portions located between the first portion and the fourth doped region in the first horizontal direction, wherein the first sub portions and the second portions are alternately arranged in the second horizontal direction.

11. The electrostatic discharge protection structure according to claim 10, wherein an area of each of the second portions in a vertical direction is greater than or equal to an area of each of the first sub portions in the vertical direction.

12. The electrostatic discharge protection structure according to claim 10, wherein the third doped region comprises:
    second sub portions arranged in the second horizontal direction and separated from one another, wherein each of the second sub portions is aligned with one of the first sub portions in the first horizontal direction.

13. The electrostatic discharge protection structure according to claim 1, further comprising:
    a fifth doped region of the first conductivity type disposed in the first well region, wherein the second doped region is located above the fifth doped region in a vertical direction.

14. The electrostatic discharge protection structure according to claim 13, wherein the first doped region is located above the fifth doped region in the vertical direction, and the fifth doped region covers the first doped region and the second doped region in the vertical direction.

15. The electrostatic discharge protection structure according to claim 1, further comprising:
    a sixth doped region of the first conductivity type disposed in the first well region, wherein the third doped region is located above the sixth doped region in a vertical direction.

16. The electrostatic discharge protection structure according to claim 15, wherein the fourth doped region is located above the sixth doped region in the vertical direction.

17. The electrostatic discharge protection structure according to claim 1, further comprising:
a seventh doped region of the second conductivity type disposed in the first well region, wherein the third doped region is located above the seventh doped region in a vertical direction.

18. The electrostatic discharge protection structure according to claim 17, wherein the fourth doped region is located above the seventh doped region in the vertical direction, and the seventh doped region covers the third doped region and the fourth doped region in the vertical direction.

19. The electrostatic discharge protection structure according to claim 1, wherein the second doped region and the gate structure are electrically connected to a first electrode, and third doped region and the fourth doped region are electrically connected to a second electrode.

\* \* \* \* \*